US009609785B1

(12) United States Patent
Babcock et al.

(10) Patent No.: US 9,609,785 B1
(45) Date of Patent: Mar. 28, 2017

(54) AIR-COOLED HEATSINK FOR COOLING INTEGRATED CIRCUITS

(71) Applicant: International Business Machines Corporation, Armonk, NY (US)

(72) Inventors: Raymond F. Babcock, Stewartville, MN (US); Matthew A. Butterbaugh, Rochester, MN (US); Eric A. Eckberg, Rochester, MN (US); Gerhard I. Meijer, Zurich (CH); David R. Motschman, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/014,114

(22) Filed: Feb. 3, 2016

(51) Int. Cl.
*H05K 7/20* (2006.01)
*H05K 1/02* (2006.01)

(52) U.S. Cl.
CPC ....... *H05K 7/20154* (2013.01); *H05K 1/0204* (2013.01); *H05K 7/20409* (2013.01)

(58) Field of Classification Search
CPC .... H05K 1/0203; H05K 1/021; H05K 1/0212; H05K 7/20154
USPC .......................... 361/703, 709–711, 718, 719
See application file for complete search history.

(56) References Cited

U.S. PATENT DOCUMENTS

| 4,448,028 | A | 5/1984 | Chao et al. |
| 6,830,098 | B1 | 12/2004 | Todd et al. |
| 8,995,132 | B2 * | 3/2015 | Kataoka ............. H01L 23/4006 165/104.33 |
| 2004/0012927 | A1 * | 1/2004 | Lee ..................... H01L 23/4093 361/719 |
| 2006/0196052 | A1 | 9/2006 | Lesage |
| 2008/0028788 | A1 | 2/2008 | Higashiyama |

(Continued)

FOREIGN PATENT DOCUMENTS

| CN | 2042943 U | 8/1989 |
| CN | 104101235 A | 10/2014 |

(Continued)

OTHER PUBLICATIONS

Unknown, "Commercial Solid Rivets," Hanson Rivet & Supply Co. Inc., Printed on Oct. 6, 2015, 3 pages, copyright © 2014 Hanson Rivet http://www.hansonrivet.com/commercial-solid-rivets.htm.

(Continued)

*Primary Examiner* — Adrian S Wilson
(74) *Attorney, Agent, or Firm* — Nicholas D. Bowman

(57) ABSTRACT

A system includes an integrated circuit and a heatsink mounted thereon. The heatsink includes a flat base plate thermally coupled to a top surface of the integrated circuit, thermally-conductive solid metal posts mounted perpendicularly on the base plate, and flat metal fins. Each of the fins has holes fitted about the posts such that the fins are mounted on the posts in vertically-spaced, parallel alignment relative to each other and the top surface of the base plate. The system further includes a load plate mounted upon top surfaces of the posts, a printed circuit board, and a microprocessor socket mounted on the printed circuit board. The microprocessor socket includes a socket base upon which the integrated circuit is mounted such that the integrated circuit is electrically coupled through the socket base to the printed circuit board. Air may be forced through the heatsink.

17 Claims, 14 Drawing Sheets

(56) References Cited

U.S. PATENT DOCUMENTS

| | | |
|---|---|---|
| 2008/0158828 A1* | 7/2008 | Chen .............. H01L 23/4093 361/719 |
| 2009/0159241 A1 | 6/2009 | Lipp et al. |
| 2011/0146952 A1 | 6/2011 | Beldring et al. |
| 2011/0155351 A1 | 6/2011 | Li et al. |
| 2011/0265976 A1 | 11/2011 | Li et al. |
| 2013/0105128 A1 | 5/2013 | Vanderwees |
| 2013/0126136 A1 | 5/2013 | Hwang et al. |
| 2013/0153183 A1 | 6/2013 | Velan |
| 2015/0159958 A1 | 6/2015 | Kimura |
| 2016/0082555 A1 | 3/2016 | Nishimura et al. |
| 2016/0097597 A1 | 4/2016 | Ishizaka |

FOREIGN PATENT DOCUMENTS

| | | |
|---|---|---|
| CN | 204461156 U | 7/2015 |
| GB | 1014855 A | 12/1965 |
| JP | 2005121297 A | 5/2005 |
| KR | 101003377 B1 | 12/2010 |
| WO | 2013042879 A3 | 3/2013 |

OTHER PUBLICATIONS

Babcock et al., "Heat Exchangers for Cooling Integrated Circuits", U.S. Appl. No. 15//014,101, filed Feb. 3, 2016.

List of IBM Patents or Patent Applications Treated as Related, Dated Jan. 29, 2016, 2 pages.

Tech Parts Warehouse, "Dell P4 CPU Heatsink Assembly Xeon Nocona Prescott SMT/TMD", TPW Part: DE-W4254 | Mfg. Part: W4254, 2 pages, Copyright 2012 TechPartsWarehouse.com.

* cited by examiner

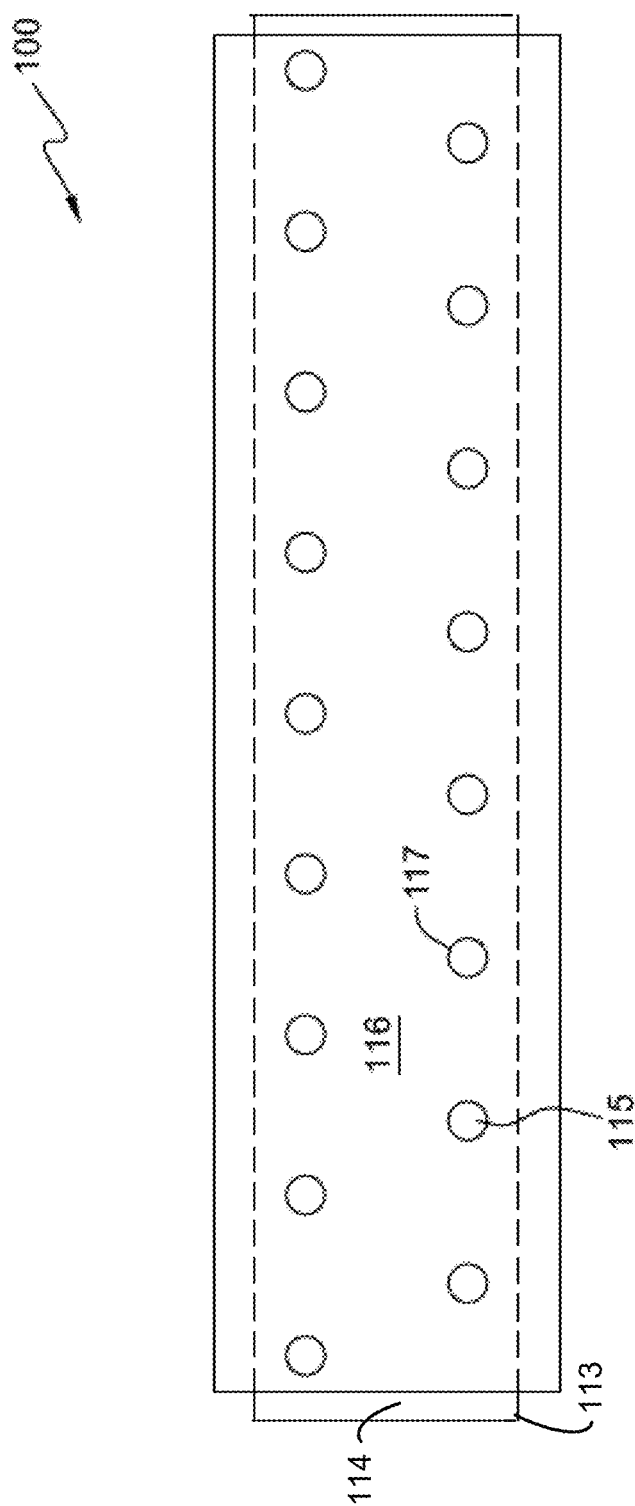

AIR-COOLED HEATSINK FOR COOLING INTEGRATED CIRCUITS

BACKGROUND

The present disclosure relates generally to the field of computer system cooling, and in particular to air-cooled heatsinks for cooling integrated circuits.

While operating within a computer system, integrated circuits may generate excess heat. Left unchecked, this excess heat may increase the operating temperatures of the integrated circuits to deleterious levels and thereby cause premature failure or suboptimal performance of the computer system. To mitigate these problems, a variety of thermally dissipative systems may be used to remove this unwanted heat from the integrated circuits that generate it.

SUMMARY

According to embodiments, aspects of the present disclosure include a system. The system comprises an integrated circuit and an air-cooled heatsink mounted on the integrated circuit. The air-cooled heatsink includes a flat base plate thermally coupled to a top surface of the integrated circuit, a plurality of thermally-conductive solid metal posts mounted perpendicularly on the base plate, and a plurality of flat metal fins. Each of the fins has a plurality of holes fitted about the plurality of posts such that the plurality of fins are mounted on the posts in vertically-spaced, parallel alignment relative to each other and the top surface of the base plate. The system further includes a load plate mounted upon top surfaces of the plurality of posts, a printed circuit board, and a microprocessor socket mounted on the printed circuit board. The microprocessor socket includes a socket base upon which the integrated circuit is mounted such that the integrated circuit is electrically coupled through the socket base to the printed circuit board.

According to embodiments, aspects of the present disclosure further include a method. As part of the method, air is forced through a heatsink positioned in a system. The system comprises an integrated circuit and the heatsink mounted on the integrated circuit. The heatsink includes a flat base plate thermally coupled to a top surface of the integrated circuit, a plurality of thermally-conductive solid metal posts mounted perpendicularly on the base plate, and a plurality of flat metal fins. Each of the fins has a plurality of holes fitted about the plurality of posts such that the plurality of fins are mounted on the posts in vertically-spaced, parallel alignment relative to each other and the top surface of the base plate. The system further includes a load plate mounted upon top surfaces of the plurality of posts, a printed circuit board, and a microprocessor socket mounted on the printed circuit board. The microprocessor socket includes a socket base upon which the integrated circuit is mounted such that the integrated circuit is electrically coupled through the socket base to the printed circuit board.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 1C illustrates an overhead view of the air-cooled heatsink shown in FIGS. 1A and 1B, in accordance with embodiments of the present disclosure.

Figure 1A:
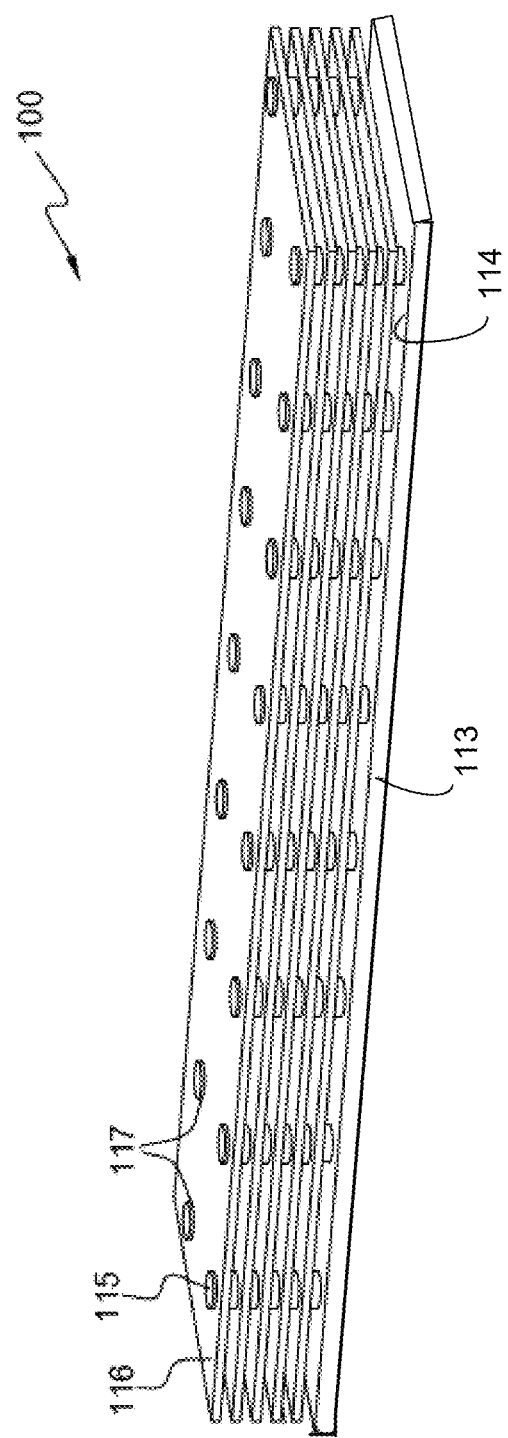
FIG. 1A illustrates an isometric view of an air-cooled heatsink, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of computer system cooling, and in particular to heatsinks for cooling integrated circuits. While the present disclosure is not necessarily limited to such applications, various aspects of the disclosure may be appreciated through a discussion of various examples using this context.

As used herein, a "set" may refer generally to one or more of the item to which it relates.

As used herein, a "computer system" may refer generally to any computer or server. Computer systems may include, without limitation, web servers, application servers, mail servers, virtual servers, supercomputers, and high performance computing systems.

As used herein, an "integrated circuit" may refer generally to a set of electronic circuits on a semiconductor plate that together provide computational capabilities for a computer system. Integrated circuits may include, without limitation, microprocessors such as central processing units (CPUs) or graphics processor units (GPUs).

As used herein, an "microprocessor socket" may refer generally to a set of mechanical and electrical components that provide a physical and electrical connection between an integrated circuit (e.g., a microprocessor such as a CPU) and a printed circuit board. Typically, the microprocessor socket allows integrated circuits to be added to (and removed from) the printed circuit board without permanent connections (e.g., solder joints) being made between them. In some situations, the microprocessor socket may include a socket base upon which the integrated circuit is mounted. The mounting may involve, in some embodiments (e.g., Land Grid Array (LGA)), electrical pins on the socket base that are forced into the bottom surface of the integrated circuit. Other mounting technologies may also be used (e.g., other surface-mount packaging technologies).

As used herein, a "heatsink" may refer generally to a passive heat exchanger that draws heat away from an electronic component and transfers the heat into a fluid. In an "air-cooled heatsink", the fluid into which the heat is transferred is air. In some embodiments, fans or other devices may be used to promote fluid movement across a heatsink.

When attempting to cool integrated circuits, a variety of thermally dissipative system may be used. One commonly used cooling device is a heat pipe. In some situations, heat pipes are mounted on a metal slug that is thermally coupled to an integrated circuit. Heat from the integrated circuit is transferred through the slug and into the heat pipes. Fluid within each heat pipe is then cycled along the height of the heat pipe through an evaporation/condensation cycle that causes the heat to dissipate. In general, heat pipes may be effective at removing waste heat; however, they may not be effective in small spaces. Specifically, heat pipes may not be effective in server environments that are one rack unit (44.45 mm) or less in height. This may be due, at least in part, to three common sources of effective height loss for heat pipes. First, a heat pipe is usually crimped at the top of its height. This crimp zone is usually about one to two pipe diameters, which for a typical 3 mm diameter heat pipe, would be about 3-6 mm. A second common loss in effective height occurs due to the slug at the bottom of the heat pipe. This slug is usually more than 3 mm thick. Third, there is usually a bend diameter of about 6 mm from where the heat pipe bottom connects to the slug and begins to curve upwardly to where the heat pipe is vertical. A sharper bend (e.g., a bend radius smaller than 6 mm) may damage a wick material in the heat pipe because the wick material tends to be brittle. Combining these three height losses means that a typical heat pipe will have between 12 mm and 15 mm of height that cannot effectively be used to contact air-cooled fins that remove heat from the heat pipe. In a one rack unit or less environment, this loss of height may mean that the heat pipe performance is significantly reduced.

Another cooling device that may be used for cooling an integrated circuit is a pin fin array. A typical pin fin array includes a base that is thermally coupled to an integrated circuit and a high concentration of pin fins that extend upwardly from the base. In use, heat is transferred from the integrated circuit, through the base of the array, and upwardly along the heights of the pin fins. Air passing over the array then removes the heat from the pin fins and draws the heat away from the array. The high pin fin density may be needed in the typical pin fin array because the pin fins provide the surface area over which heat is dissipated from the array. This high concentration of vertical structures found in the typical pin fin array may not be found in some embodiments of the present disclosure. Specifically, in some embodiments, only a few vertical metal conduction posts may be needed to conduct heat to parallel flat metal fins that have considerable surface area. One problem that may be associated with pin fin arrays is a large air pressure drop across an array. Specifically, the high concentration of pin fins may cause significant air resistance (e.g., impedance) to air flowing around the pin fins. This may be due to a much higher pin fin density found in typical pin fin arrays as compared to metal conduction post density found in some comparable embodiments of heatsinks of this disclosure.

Yet another cooling device that may be used for integrated circuit cooling is traditional heatsink that includes several parallel flat fins that are mounted perpendicularly on a base surface that is thermally coupled to an integrated circuit. When this heatsink is used, heat is transferred up through the base and into the parallel fins. Air then flows through channels formed between neighboring fins and convects (e.g., draws) the heat away from the fins. These heatsinks may be acceptable under circumstances where air tends to flow across the heatsink in only one direction. In situations where the air flows in different patterns that have different directions across the heatsink, the effectiveness of such a design may be significantly reduced. Specifically, if the air flows in a direction perpendicular to the fins, then the air will not flow through the perpendicular fins, and the heatsink's effectiveness will be thereby eliminated and high air flow impedance will be added for the entire system.

Another disadvantage of heatsinks with fins perpendicular to their bases described above is that they may be difficult to use in conjunction with load plates. Specifically, in some embodiments, load plates are solid structures designed for use in applying the pressure needed to hold an integrated circuit tightly against a socket base of a microprocessor socket. Typically, a load (a weight, pressure from straps or latches, etc.) is applied to the top surface of the load plate. The pressure from that load propagates down to the integrated circuit and presses it against the socket base. In some embodiments, a heatsink of the present disclosure may be capable of supporting significant loads from a load plate because the heatsink may have relatively large diameter metal conduction posts that are structurally more stable than thin perpendicular fins (as may be found in comparable heatsinks with perpendicular fins) and that are also structurally more stable than small diameter pins (as may be found in comparable pin fin heatsinks).

In some situations, load plate pressure can create undue stress on objects positioned between the load plate and the integrated circuit. For example, in a situation where the heatsink with perpendicular fins described above is used, the pressure from the load plate can damage the perpendicular fins extending upwardly from the base of the heatsink.

To avoid this damage, modifications may sometimes be made to the cooling devices receiving the pressure from the load plate. For example, the heatsink described above may be modified such that perpendicular fins in a significant portion of its base surface are removed so that the load plate can be positioned directly on the base of the heatsink. These modifications are not without drawbacks, however. For example, the removal of pins or perpendicular fins (from a pin fin array and a heatsink, respectively) may significantly reduce the ability of the cooling device to draw heat away from the integrated circuit to which it is attached (e.g., fewer pins means less surface area for air to contact and cool).

In some embodiments of the present disclosure, an integrated circuit mounted on a socket base of a microprocessor socket may be cooled using a heatsink that is both configured to receive air flow from multiple directions without significant changes in air resistance and configured to be usable in small spaces, such as one rack unit or less environments. In addition, according to some embodiments, the heatsink may incorporate solid metal conduction posts that can, without significant risk of damage, propagate load plate pressure down to the integrated circuit beneath the heatsink.

Figure 1B:
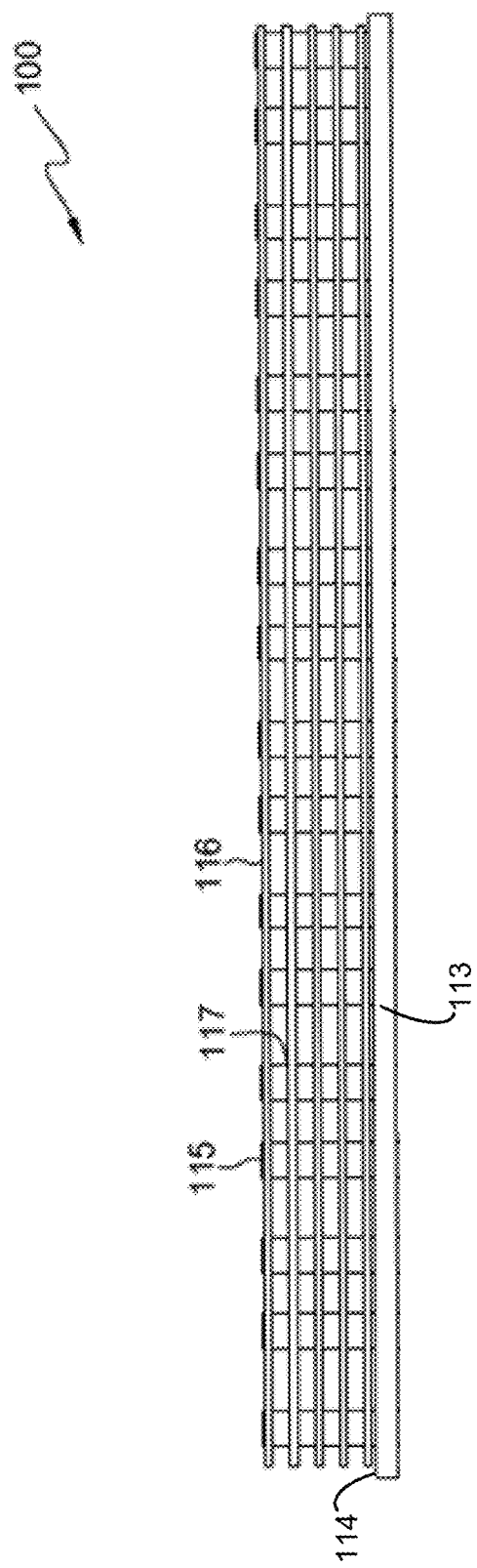
FIG. 1B illustrates a side view of the air-cooled heatsink shown in FIG. 1A, in accordance with embodiments of the present disclosure.
Figure 5A:
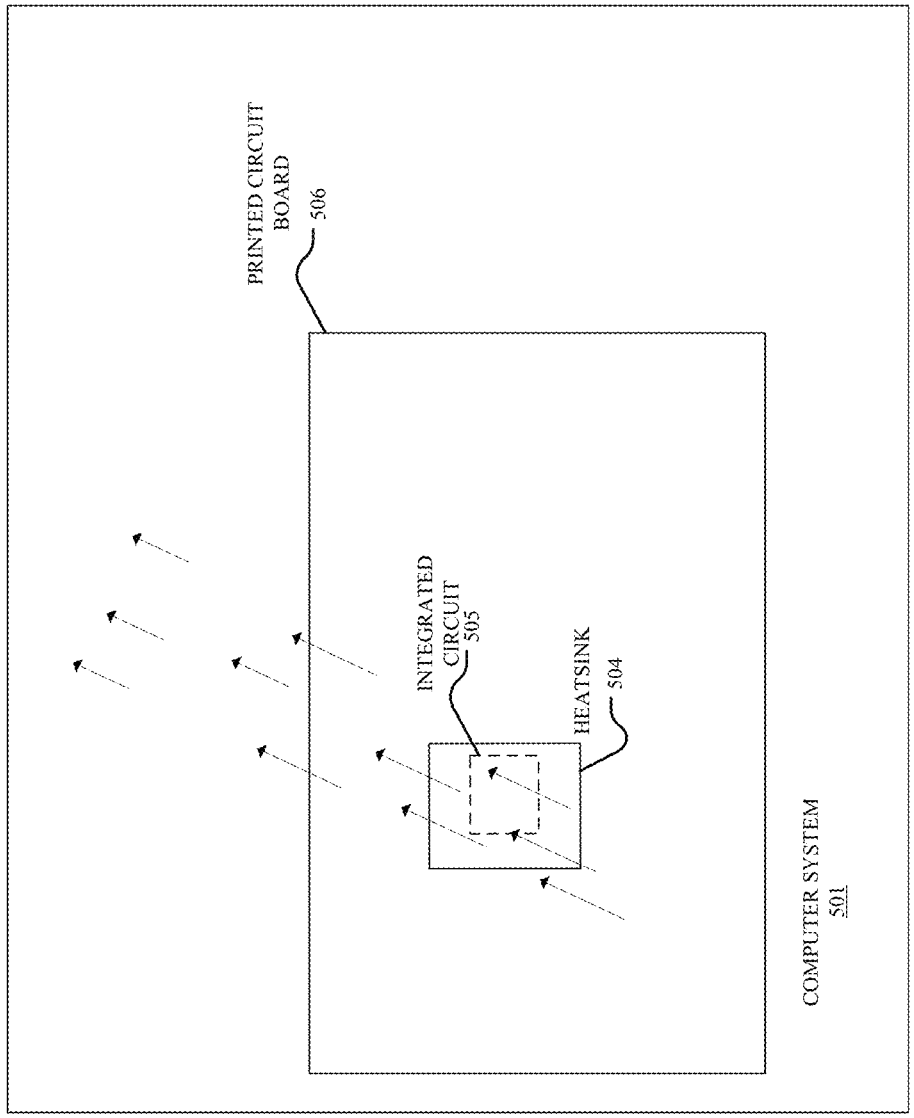
FIG. 5A illustrates a schematic diagram of a cooling system located within a computer system and configured for using an air-cooled heatsink with a top-mounted load to cool an integrated circuit, in accordance with embodiments of the present disclosure.
Figure 5B:
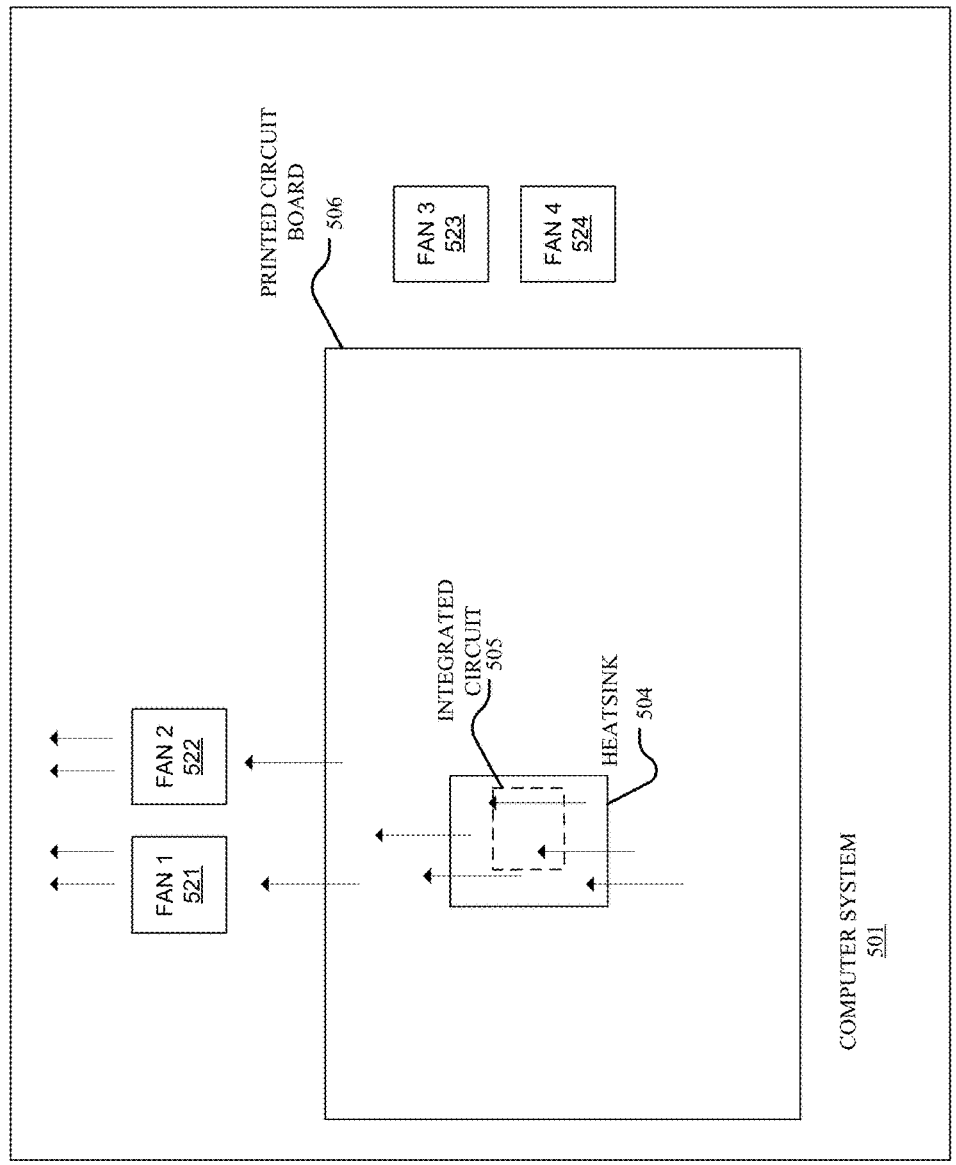
FIG. 5B illustrates a different air flow pattern through the heatsink shown in FIG. 5A that occurs when a first set of fans is used to draw the air through the heatsink, in accordance with embodiments of the present disclosure.
Figure 5C:
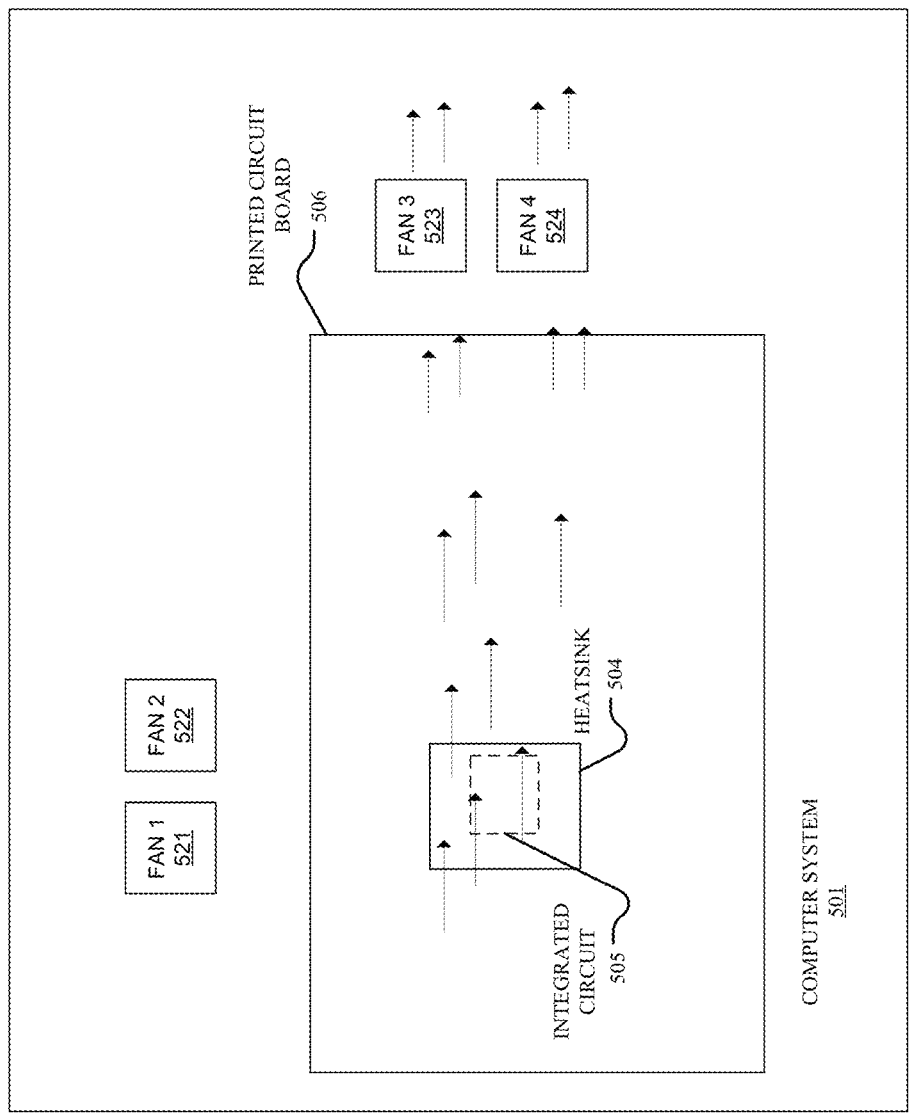
FIG. 5C illustrates a second different air flow pattern through the heatsink shown in FIGS. 5A and 5B that occurs when a second set of fans is used to draw the air through the heatsink, in accordance with embodiments of the present disclosure.

Referring now to FIGS. 1A-1C, shown are three different views of an air-cooled heatsink 100, in accordance with embodiments of the present disclosure. In some embodiments, the air-cooled heatsink 100 may be used for cooling an integrated circuit within a computer system (e.g., as shown in FIGS. 5A, 5B, and 5C). As shown in the isometric view (FIG. 1A), the side view (FIG. 1B), and/or the overhead view (FIG. 1C), the heatsink 100 includes a flat metal base plate 113.

A top surface 114 of the base plate 113 serves as a base for an upper portion of the heatsink 100. Mounted perpendicularly upon this top surface 114 is a plurality of thermally-conductive solid (e.g., non-hollow) metal posts 115. In some embodiments, the posts 115 may be soldered onto the top surface 114. Mounted upon these posts 115 is a plurality of flat metal fins 116. These fins 116 each have a plurality of holes (e.g., slots) 117 that are fitted about the lengths of the posts 115. As depicted, each fin 116 includes a hole 117 corresponding to each post 115 such that the number of holes 117 in each fin 116 equals the number of posts 115. In some embodiments, good thermal contact between the posts 115 and the fins 116 may be achieved by soldering, press fitting, or other connection methods known in the industry. As mounted, the fins 116 are in vertically-spaced, parallel alignment relative to each other and the top surface 114.

When the heatsink 100 is in use, heat generated by an integrated circuit positioned beneath the heatsink 100 is drawn up through the base plate 113 and transferred to bases of the posts 115. The heat is then transferred upwardly along the lengths of the posts 115. From these posts 115, the heat is transferred outwardly across the flat surfaces of the fins 116. Air passing between the fins 116 then removes the heat from the flat surfaces of the fins 116 and draws the heat away from the heatsink 100.

In some embodiments, the heatsink 100 may be configured such that resistance to air flow passing between the fins 116 is substantially the same for multiple directions of air flow. For example, in one embodiment, if the air flow through the heatsink 100 were to change from a first direction parallel to the surfaces of the fins 116 to a second direction that is also parallel to the surfaces of the fins 116 but is perpendicular to the first direction, this new air flow path would be allowed by the heatsink 100, whereas the air flow would be blocked by a traditional heatsink having perpendicular fins. In some embodiments, the air flow resistance caused by the heatsink 100 remains substantially the same, as long as the air flows parallel to the fins 116, regardless of the direction of the air flow.

In some embodiments, the heatsink 100 may be configured to be used in small spaces within a computer environment. For example, in some embodiments, the entire heatsink 100 may be configured to be less than two rack units (88.90 mm) in height. In some embodiments, the heatsink 100 may be configured to be less than one rack unit (44.45 mm) in height. Specifically, in some embodiments, the vertical distance between the top-most points on the posts 115 and the bottom surface of the base plate 113 may be less than 88.90 mm or less than 44.45 mm.

Figure 2A:
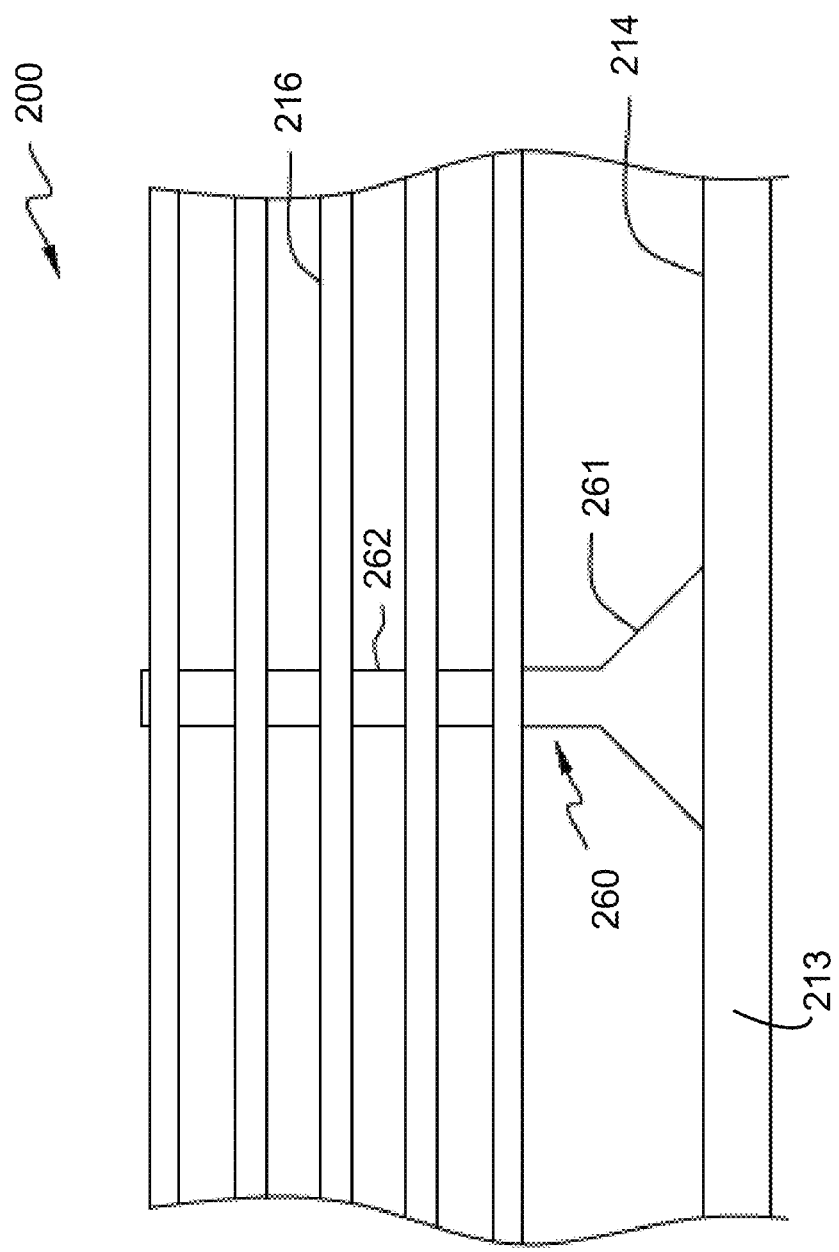
FIG. 2A illustrates a side view of a conically-based solid metal post mounted in an air-cooled heatsink, in accordance with embodiments of the present disclosure.

Referring now to FIG. 2A, shown is a side view of a conically-based solid metal post 260 mounted in an air-cooled heatsink 200, in accordance with embodiments of the present disclosure. In some embodiments, the heatsink 200, only a small portion of which is shown in FIG. 2A, may be substantially similar to the heatsink 100 described in reference to FIGS. 1A-1C. Specifically, as depicted, the heatsink 200 includes a flat base plate 213 upon which a plurality of solid metal posts (of which only one post, 260, is shown) are mounted. A plurality of fins 216 are mounted on the post 260.

As depicted, the post 260 includes a conical (i.e., conically-shaped) base portion 261 and cylindrical length portion 262 that extends upwardly from the top of the base portion 261. A bottom, circular surface of the base portion 261, which may be mounted on a top surface 214 of the base plate 213, has a diameter x that is greater than the diameter y of the length portion 262, upon which the fins 216 are mounted. In some embodiments, x is at least twenty-five percent greater than y. In some embodiments, the post 260 may be a commercially-available flathead rivet.

In some embodiments, the shape of the post 260 may offer certain advantages over a similar cylindrical post that has a constant width from bottom to top. Specifically, a wider base portion 261 may allow for more effective heat transfer from the top surface 214 of the base plate 213 to the post 260 because of the relatively large surface area of the bottom of base portion 261. Also, the narrower length portion 262 may allow for less resistance to air flow between the fins 216 because the relatively small side surface area of the length portion blocks less of the air flow.

Figure 2B:
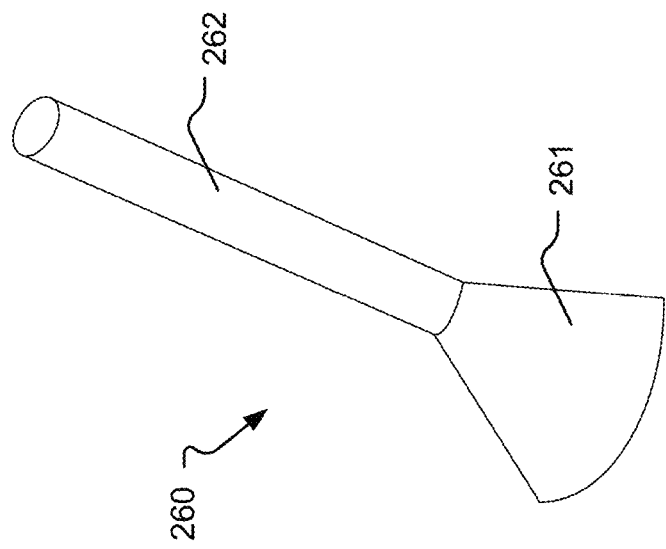
FIG. 2B illustrates an isometric view of the conically-based post shown in FIG. 2A in isolation, in accordance with embodiments of the present disclosure.

FIG. 2B shows an isometric view of the conically-based post 260 shown in FIG. 2A in isolation, in accordance with embodiments of the present disclosure.

Figure 3A:
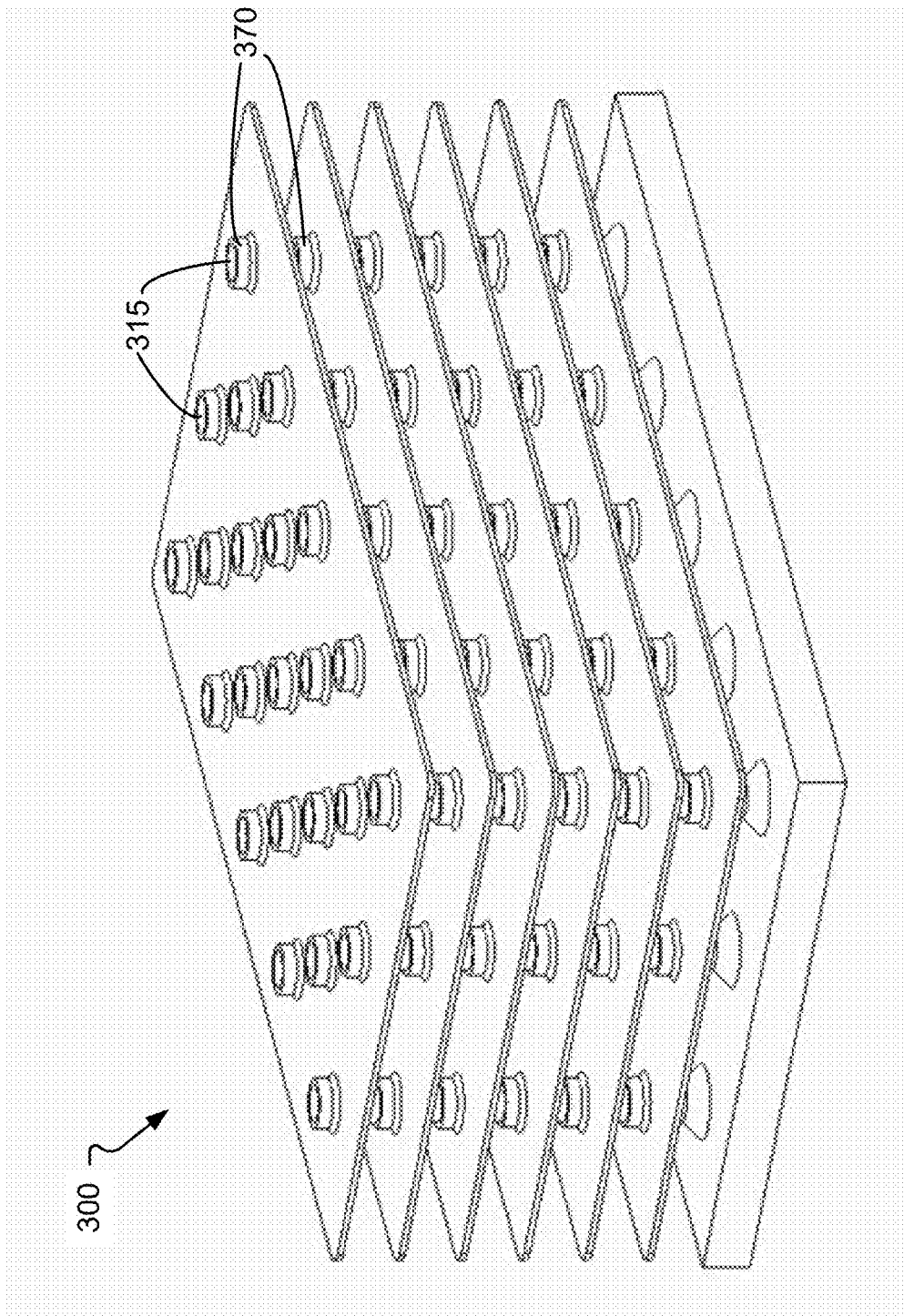
FIG. 3A illustrates an isometric view of an air-cooled heatsink with collaring about its metal posts, in accordance with embodiments of the present disclosure.

Referring now to FIG. 3A, shown is an isometric view of an air-cooled heatsink 300 with collaring about its metal posts 315, in accordance with embodiments of the present disclosure. In some embodiments, the metal collars 370 may be formed when the holes in the fins are created. For example, forcing the metal posts 315 through the fins during construction of the heatsink 300 may cause the collaring to occur.

Figure 3B:
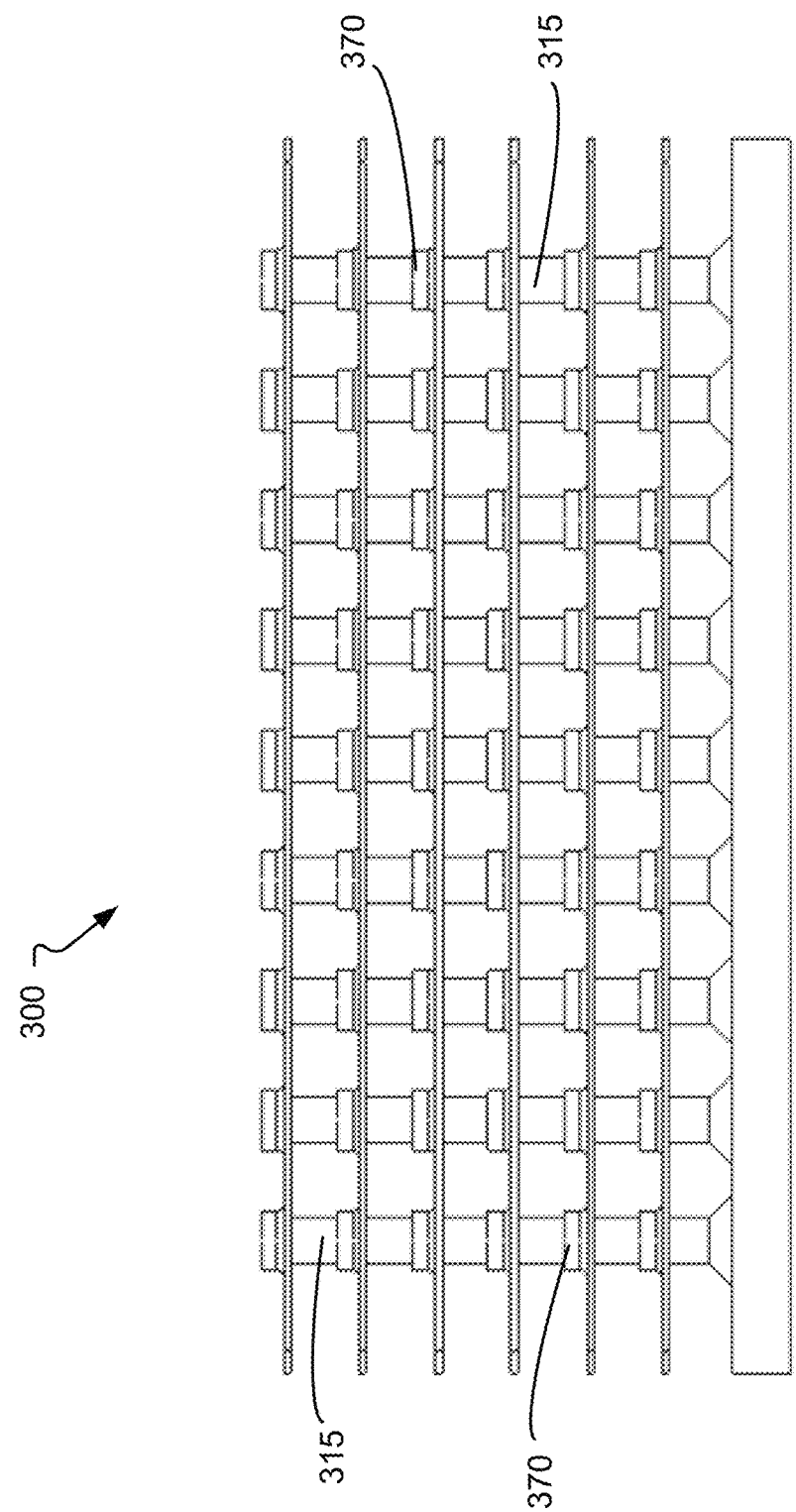
FIG. 3B illustrates a side view of the air-cooled heatsink with collaring about its metal posts shown in FIG. 3A, in accordance with embodiments of the present disclosure.

FIG. 3B shows a side view of the air-cooled heatsink 300 shown in FIG. 3A, in accordance with embodiments of the present disclosure.

Figure 4:
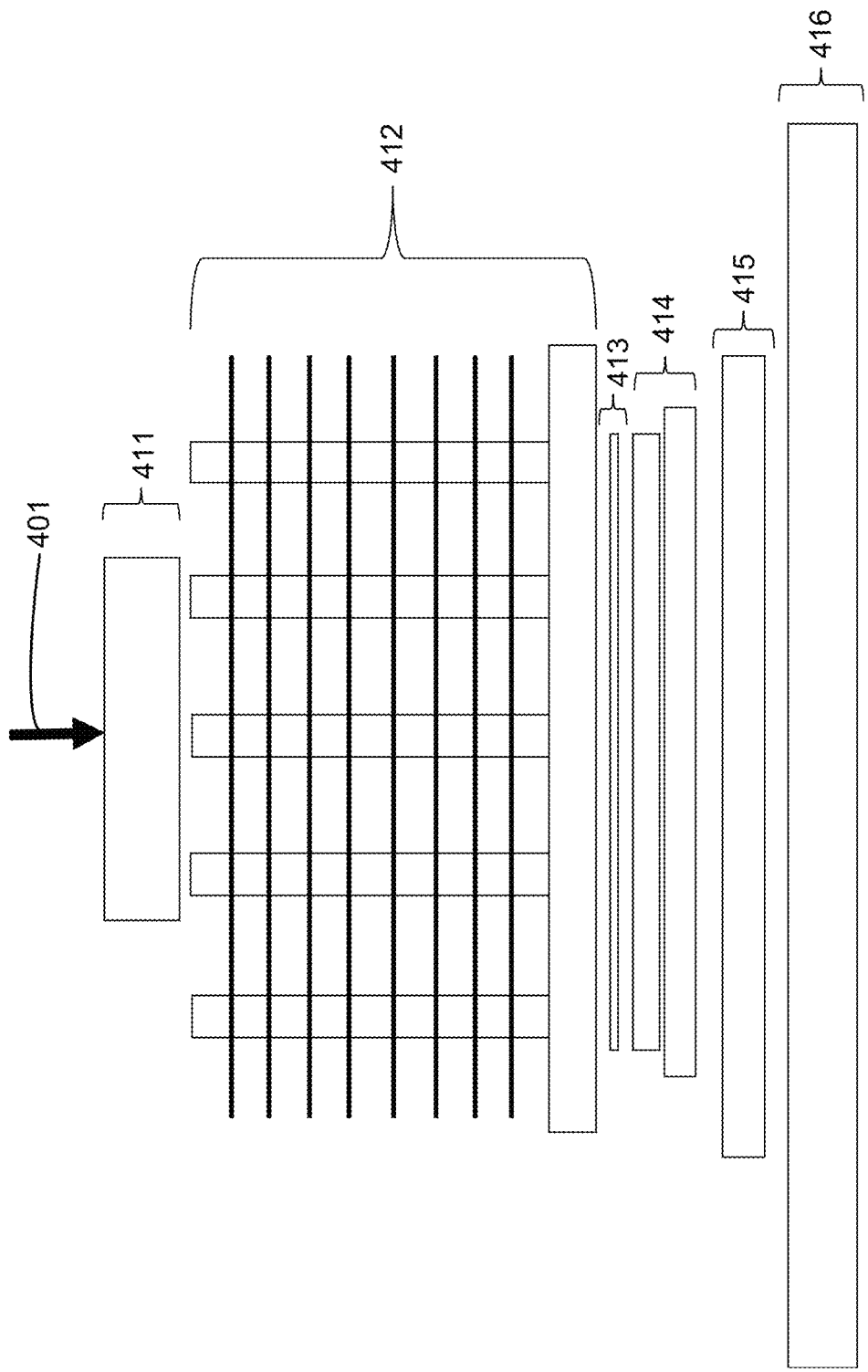
FIG. 4 illustrates a schematic diagram showing the layers of an example load stack that compresses an integrated circuit firmly against a microprocessor socket, in accordance with embodiments of the present disclosure.

Referring now to FIG. 4, shown is a schematic diagram showing the layers of an example load stack that compresses an integrated circuit firmly against an microprocessor socket, in accordance with embodiments of the present disclosure. At the top of the load stack is a load plate 411. The load plate 411 includes the main surface upon which a downward pressure is applied to the load stack. Beneath the load plate 411 is the heatsink 412. In some embodiments, the heatsink 412 may be substantially similar to the heatsink 100 shown in FIGS. 1A-1C. Furthermore, in some embodiments, the heatsink 412 may be designed specifically so that it effectively maintains low airflow impedance in environments that are prone to multi-directional airflow. As shown, the load plate 411 rests upon metal posts of the heatsink 412. In some embodiments, this may mean that pressure from the load plate 411 propagates down through the metal posts of the heatsink 412 without propagating through the fins of the heatsink 412. This may help to keep the fins from being damaged due to undue stress being placed upon them.

Between the base plate of the heatsink 412 and a microprocessor module 414 is a thermal interface material (TIM) 413. The TIM 413 may be a heat-conductive adhesive that joins the heat sink 412 and the microprocessor module 414. In the depicted example, the microprocessor module 414 includes the integrated circuit from which the heatsink 412 is adapted to remove waste heat.

Beneath the microprocessor module 414 is a microprocessor socket, specifically, an LGA connector 415. In some embodiments, the main purpose of applying a load to the load plate 411 is to force the microprocessor module 414 firmly against this LGA connector 415. In other embodiments, other types of microprocessor sockets may be used. Beneath the LGA connector 415 is a printed circuit board 416.

An example construction of the load stack shown in FIG. 4 is described. In this example, the LGA connector 415 is mounted on the printed circuit board 416 and soldered thereto. Next, the microprocessor module 414 is placed on the LGA connector 415. The TIM 413 is applied to the top surface of the microprocessor module 414 and the heatsink 412 is adhered to the microprocessor module 414 by the TIM 413. The load plate 411 is then mounted upon the metal posts of the heatsink 412. When the load stack is placed in use, a load represented by the arrow 401 is applied to the load plate 411. An example of a load 401 (e.g., compression force) that may be applied to the load plate 411 is downward pressure caused by closing latches (not shown) down onto the top corners of the load plate 411. These latches may be rotationally connected to the printed circuit board 416 (or a stiffener below the printed circuit board 416) such that they engage the load plate with a downward force when they are swung to a closed position over the load stack.

While an example load stack is described with reference to FIG. 4, many other load stacks including more, less, or different layers than those described herein may be employed in some embodiments. Furthermore, in some embodiments, a heatsink, such as heatsink 412, may ultimately be mounted on a microprocessor module by means other than applying a load to a load plate positioned on top of the heatsink. For example, the heatsink may be mounted by gluing it down to the surface upon which it is mounted.

Referring now to FIG. 5A, shown is a schematic diagram of a cooling system located within a computer system 501 and configured for using an air-cooled heatsink 504 with a top-mounted load to cool an integrated circuit 505, in accordance with embodiments of the present disclosure. As shown, within the computer system 501, the integrated circuit 505 is located between a heatsink 504 and a printed circuit board 506. In some embodiments, the heatsink 504 is substantially similar to the heatsink 100 described in reference to FIGS. 1A-1C. In the depicted example, the arrows within the computer system 501 represent the direction of flow of air as it moves through the cooling system. Specifically, the airflow as shown is moving diagonally through the fins of the heatsink 504. In use, the heatsink 504 draws operational heat from the integrated circuit 505 and disperses the heat through its fins into the flowing air. The air flow through the heatsink 504 may be caused, in some embodiments, by a set of fans and/or by positive or negative air pressure within the computer system 501.

Referring now to FIG. 5B, shown is a different air flow pattern through the heatsink 504 shown in FIG. 5A that occurs when a first set of fans 521 and 522 is used to draw the air through the heatsink 504, in accordance with embodiments of the present disclosure. In the depicted example, the first set of fans (including fan 521 and fan 522) is turned on and being used to draw air between the fins (not shown) of heatsink 504. The direction of air flow is, once again, represented by arrows. In this example, a second set of fans (including fans 523 and 524) is turned off. As shown, the fans of the first set, 521 and 522, draw the air across the heatsink 504, through their respective inlets, and out of their respective exhausts.

Referring now to FIG. 5C, shown is a second different air flow pattern through the heatsink 504 shown in FIGS. 5A and 5B that occurs when the second set of fans 523 and 524 is used to draw the air through the heatsink 504, in accordance with embodiments of the present disclosure. In this second depicted example, the second set of fans (including fan 523 and fan 524) is turned on and being used to draw the air between the fins (not shown) of heatsink 504. The new direction of air flow is represented by arrows. In this second different example, the fans 521 and 522 are turned off, and the fans of the second set, 523 and 524, draw the air across the heatsink 504, through their respective inlets, and out of their respective exhausts.

As can be seen by comparing FIGS. 5B and 5C, the differences in which of the fans 521-524 are used may have a substantial impact on the direction of air flow across the heatsink 504. In some embodiments, a multitude of other air flow patterns may occur depending on which of the fans 521-524 are being used at any given time and the fan speed of each of the fans that are being used. A potential cause of one or more fans 521-524 not being used is fan failure. Thus, in some embodiments, the heatsink 504 may be less susceptible to negative impact of fan failure than a comparable heatsink that does not easily adjust to changes in air flow patterns.

While an example embodiment of a computer system 501 is depicted in FIGS. 5A-5C, it should be understood that, in some embodiments, many other variants of the computer system 501 are possible.

Figure 6A:
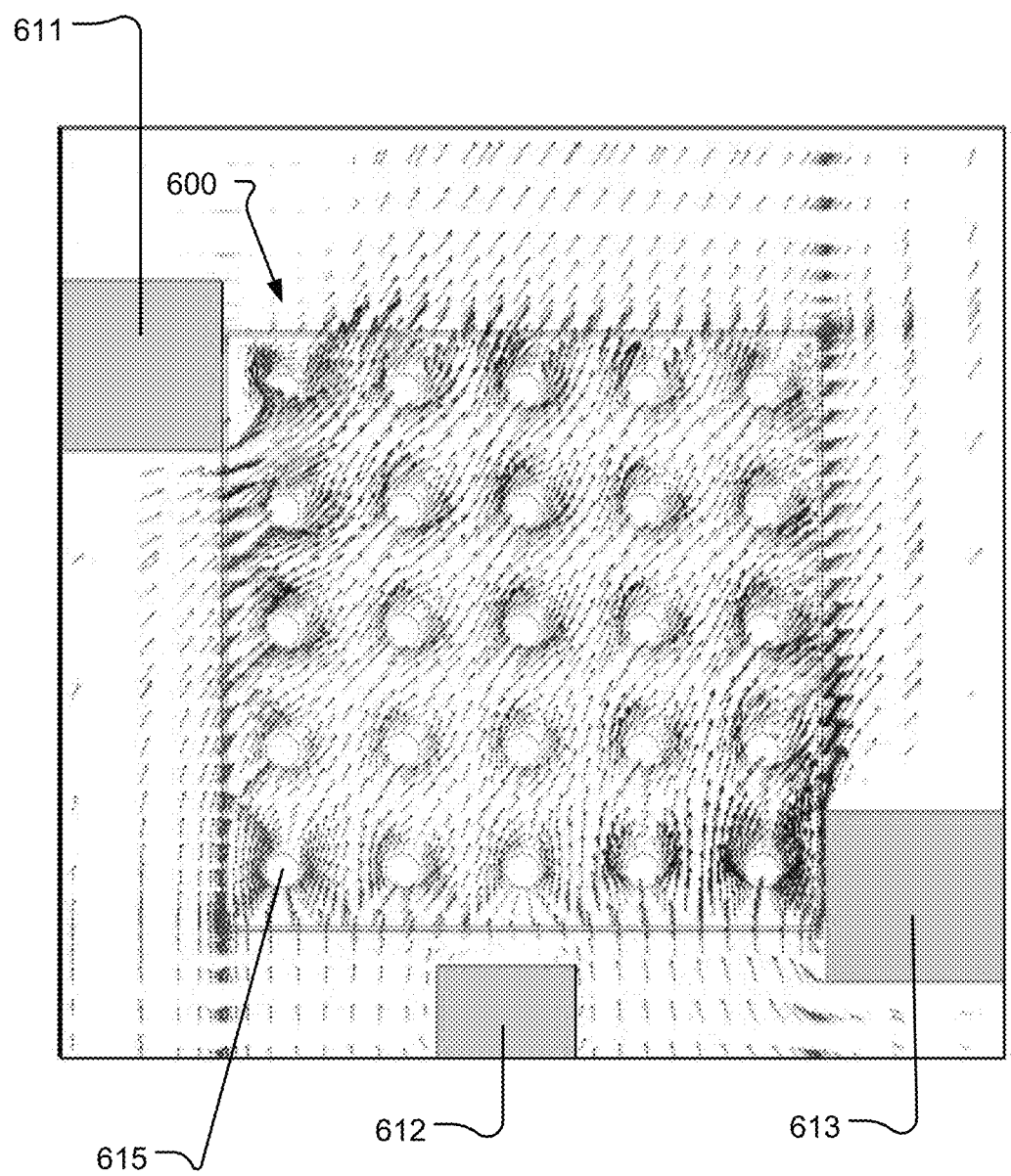
FIG. 6A illustrates an overhead view of an air flow diagram showing air flowing through a heatsink, wherein there is minimal side blockage on two sides of the heatsink including blockage caused by an obstacle representative of obstacles that may be at or near inlets or exits of heatsinks, in accordance with embodiments of the present disclosure.

Referring now to FIG. 6A, shown is an overhead view of an air flow diagram showing air flowing through a heatsink 600, wherein there is minimal side blockage on two sides of the heatsink 600, in accordance with embodiments of the present disclosure. A detailed view of the air flow between the fins (and around the metal posts 615) of the heatsink 600 is provided. In some embodiments, the heatsink 600 may be substantially similar to the heatsink 100 described in reference to FIGS. 1A-1C. In this example, the air is flowing from the bottom and left sides of the image of heatsink 600 and toward the top and right sides of the image. The air flow in this example is being blocked by shaded areas 611, 612, and 613. The side blockages, 611 and 613, only span a width of about one row of metal posts 615 each.

Figure 6B:
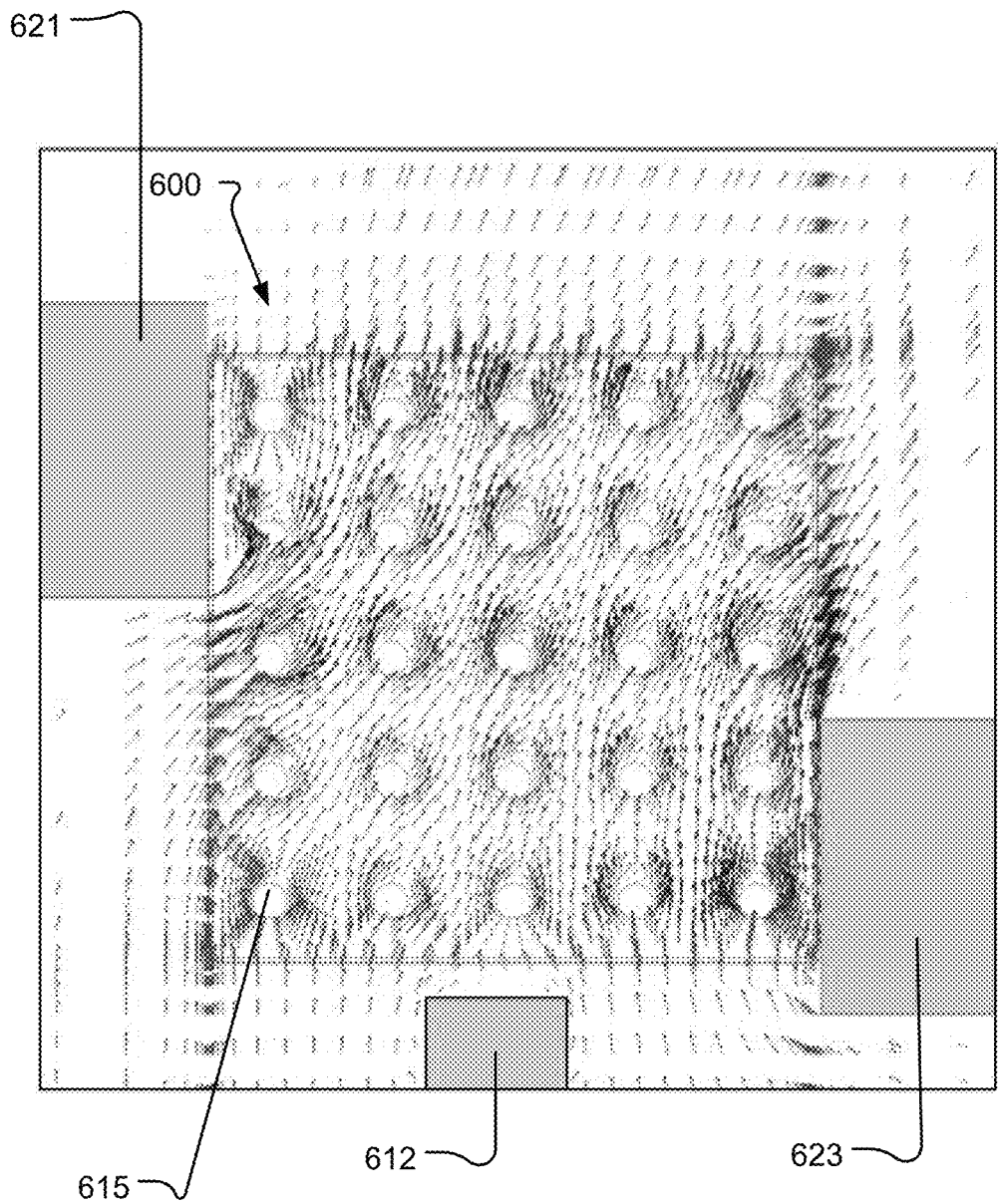
FIG. 6B illustrates a second overhead view of the air flow diagram showing air flowing through the heatsink shown in FIG. 6A, wherein there is moderate side blockage on the two sides of the heatsink including blockage caused by an obstacle representative of obstacles that may be at or near inlets or exits of heatsinks, in accordance with embodiments of the present disclosure.

Referring now to FIG. 6B, shown is a second overhead view of the air flow diagram showing air flowing through the heatsink 600 shown in FIG. 6A, wherein there is moderate side blockage on the two sides of the heatsink 600, in accordance with embodiments of the present disclosure. In this second example, the air continues flowing from the bottom and left sides of the image of heatsink 600 and toward the top and right sides, but the effect of the blockages causes the air flow pattern to be different from what it was in FIG. 6A. The air flow in this second example is being blocked by shaded areas 611, 622, and 623. The side blockages, 621 and 623, span the width of about two rows of metal posts 615 each.

Figure 6C:
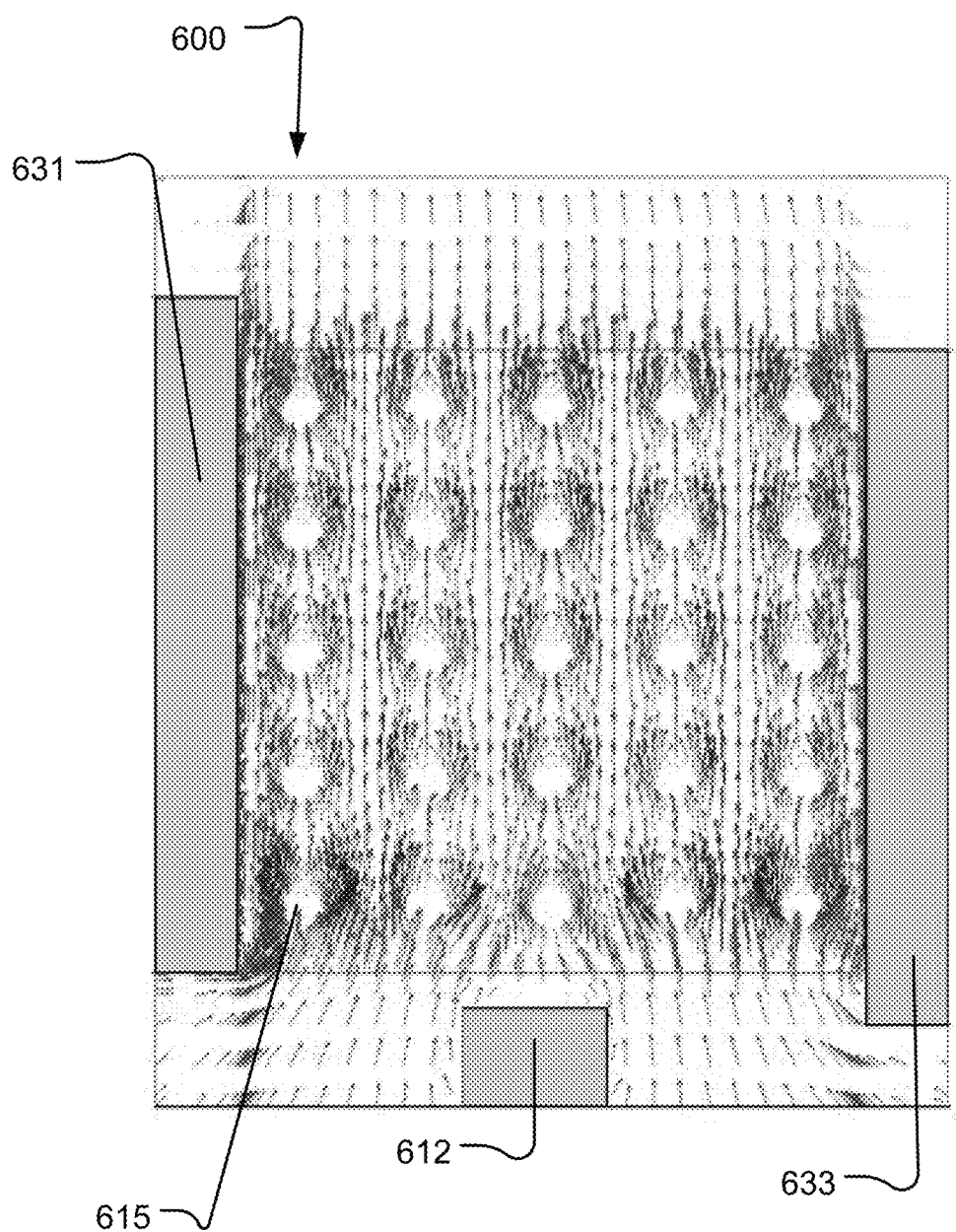
FIG. 6C illustrates a third overhead view of the air flow diagram showing air flowing through the heatsink shown in FIGS. 6A and 6B, wherein there is full side blockage on the two sides of the heatsink including blockage caused by an obstacle representative of obstacles that may be at or near inlets or exits of heatsinks, in accordance with embodiments of the present disclosure.

Referring now to FIG. 6C, shown is a third overhead view of the air flow diagram showing air flowing through the heatsink 600 shown in FIGS. 6A and 6B, wherein there is full side blockage on the two sides of the heatsink 600, in accordance with embodiments of the present disclosure. In this third example, the air flows from the bottom side of the image of heatsink 600 and toward the top side. The air flow in this example is being blocked by shaded areas 611, 632, and 633. The side blockages, 631 and 633, span entire widths of the left and right sides of the heatsink 600, respectively.

As can be seen by comparing FIGS. 6A, 6B, and 6C, the heatsink 600 is able to operate effectively with varying degrees and angles of blockage with minimal impact to airflow impedance. This would not be the case with a heatsink that has fins perpendicular to its base, as the effectiveness of such a heatsink would be greatly impacted by these changes in blockages.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the foregoing detailed description of exemplary embodiments of the various embodiments, reference was made to the accompanying drawings (where like numbers represent like elements), which form a part hereof, and in which is shown by way of illustration specific exemplary embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the foregoing description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A system comprising:
    an integrated circuit;
    an air-cooled heatsink mounted on the integrated circuit, the air-cooled heatsink comprising:
        a flat base plate thermally coupled to a top surface of the integrated circuit;
        a plurality of thermally-conductive solid metal posts mounted perpendicularly upon the base plate; and
        a plurality of flat metal fins, each fin of the plurality of fins having a plurality of holes fitted about the plurality of posts such that the plurality of fins are mounted on the plurality of posts in vertically-spaced, parallel alignment relative to each other and the top surface of the base plate;
    a load plate mounted upon top surfaces of the plurality of posts;
    a printed circuit board; and
    a microprocessor socket mounted on the printed circuit board, the microprocessor socket including a socket base upon which the integrated circuit is mounted such that the integrated circuit is electrically coupled through the socket base to the printed circuit board.

2. The system of claim 1, wherein a compression force applied to the load plate propagates downwardly through the plurality of posts and the base plate and compresses the integrated circuit against the socket base.

3. The system of claim 2, wherein the compression force applied to the load plate does not propagate through the plurality of fins.

4. The system of claim 1,
    wherein the base plate is configured to remove, from a top surface of the integrated circuit, waste heat generated by the integrated circuit,
    wherein bases of the plurality of posts are configured to remove the waste heat from the base plate and are further configured to transfer the waste heat upwardly along the plurality of posts, and wherein the plurality of fins are configured to obtain the waste heat from the plurality of posts and are further configured to spread the waste heat outwardly across flat surfaces of the plurality of fins such that air passing between the plurality of fins removes the waste heat from the flat surfaces of the plurality of fins and transfers the waste heat away from the heatsink.

5. The system of claim 1, wherein the heatsink is configured to allow the flow of air passing between the plurality of fins in a first direction to substantially a same extent as air passing between the plurality of fins in a second direction, wherein the first and second directions are parallel to the flat surfaces of the plurality of fins and perpendicular to each other.

6. The system of claim 1 further comprising:
a set of fans configured to force air to pass between the plurality of fins such that the air removes waste heat from the flat surfaces of the plurality of fins and transfers the waste heat away from the heatsink.

7. The system of claim 1, wherein a height of the heatsink is less than 44.45 mm.

8. The system of claim 1, wherein a thickness of the base plate is less than 2 mm.

9. The system of claim 1, wherein each post of the plurality of posts comprises a conically-shaped base portion having a bottom surface mounted on a top surface of the base plate and a cylindrical length portion upon which the plurality of fins are mounted.

10. A method comprising:
forcing air through a heatsink positioned in a system, wherein the system comprises:
an integrated circuit;
the heatsink mounted on the integrated circuit, the heatsink comprising:
a flat base plate thermally coupled to a top surface of the integrated circuit;
a plurality of thermally-conductive solid metal posts mounted perpendicularly upon the base plate; and
a plurality of flat metal fins, each fin of the plurality of fins having a plurality of holes fitted about the plurality of posts such that the plurality of fins are mounted on the plurality of posts in vertically-spaced, parallel alignment relative to each other and the top surface of the base plate;
a load plate mounted upon top surfaces of the plurality of posts;
a printed circuit board; and
a microprocessor socket mounted on the printed circuit board, the microprocessor socket including a socket base upon which the integrated circuit is mounted such that the integrated circuit is electrically coupled through the socket base to the printed circuit board.

11. The method of claim 10, further comprising:
positioning a load on the load plate such that a compression force applied to the load plate by the load propagates downwardly through the plurality of posts and the base plate and compresses the integrated circuit against the socket base.

12. The method of claim 11, wherein the compression force applied to the load plate by the load does not propagate through the plurality of fins.

13. The method of claim 10, wherein the heatsink is configured to allow the flow of air passing between the plurality of fins in a first direction to substantially a same extent as air passing between the plurality of fins in a second direction, wherein the first and second directions are parallel to the flat surfaces of the plurality of fins and perpendicular to each other.

14. The method of claim 10, wherein the forcing of the air through the heatsink is performed by a set of fans configured to force air to pass between the plurality of fins such that the air removes waste heat from the flat surfaces of the plurality of fins and transfers the waste heat away from the heatsink.

15. The method of claim 10, wherein a height of the heatsink is less than 44.45 mm.

16. The method of claim 10, wherein a thickness of the base plate is less than 2 mm.

17. The method of claim 10, wherein each post of the plurality of posts comprises a conically-shaped base portion having a bottom surface mounted on a top surface of the base plate and a cylindrical length portion upon which the plurality of fins are mounted.

* * * * *